United States Patent
Lai et al.

(10) Patent No.: US 8,493,259 B2
(45) Date of Patent: Jul. 23, 2013

(54) PIPELINE ANALOG-TO-DIGITAL CONVERTER

(75) Inventors: Fang-Shi Jordan Lai, Chia Yi (TW); Hsu-Feng Hsueh, Tainan (TW); Chin-Hao Chang, Hsinchu (TW); Cheng Yen Weng, Hsinchu (TW); Chih-Cheng Lu, Tainan (TW); Manoj M. Mhala, Hsinchu (TW); Yung-Fu Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 54 days.

(21) Appl. No.: 13/311,639

(22) Filed: Dec. 6, 2011

(65) Prior Publication Data

US 2013/0141260 A1 Jun. 6, 2013

(51) Int. Cl.
*H03M 1/34* (2006.01)

(52) U.S. Cl.
USPC ............ 341/162; 341/161; 341/155; 341/120

(58) Field of Classification Search
USPC .......................... 341/161, 162, 117–120, 155
See application file for complete search history.

(56) References Cited

U.S. PATENT DOCUMENTS

| | | | | |
|---|---|---|---|---|
| 4,034,983 A * | 7/1977 | Dash et al. | | 463/3 |
| 6,861,969 B1 * | 3/2005 | Ali | | 341/161 |
| 7,205,921 B1 * | 4/2007 | Savla | | 341/155 |
| 7,450,050 B2 * | 11/2008 | Rezayee et al. | | 341/161 |
| 2007/0247348 A1 * | 10/2007 | Rezayee et al. | | 341/161 |
| 2010/0182185 A1 * | 7/2010 | Shin et al. | | 341/159 |
| 2011/0210877 A1 * | 9/2011 | Ali et al. | | 341/120 |
| 2011/0221520 A1 * | 9/2011 | Bales | | 330/51 |

OTHER PUBLICATIONS

Fan, J.L. et al., "A Robust and Fast Digital Background Calibration Technique for Pipelined ADCs", IEEE Transation on Circuits and Systems-1: Regular Papers, Jun. 2007, 54(6):1213-1223.

Fan, J.L. et al., "A Robust Background Calibration Technique for Switched-Capacitor Pipelined ADC's", IEEE International Symposium on Circuits and Systems, May 2005, 2:1374-1377.

* cited by examiner

*Primary Examiner* — Jean B Jeanglaude
(74) *Attorney, Agent, or Firm* — Duane Morris LLP

(57) ABSTRACT

A pipelined ADC includes a first, second, and third pairs of comparators. The first pair of comparators compare an input voltage to a first positive reference voltage and to a first negative reference voltage. The second pair of comparators compare the input voltage to a second positive reference voltage and to a second negative reference voltage. Each comparator of the first and second pairs of comparators outputs a digital signal to an encoder. A third pair of comparators compares the input voltage to a third positive reference voltage and to a third negative reference voltage, and a comparator compares the input voltage to ground. The comparator and each comparator of the third pair of comparators is configured to output respective digital signals to an encoder. A multiplying digital-to-analog converter outputs a voltage based on the input voltage, an output from the encoder, and an output of the random number generator.

20 Claims, 10 Drawing Sheets

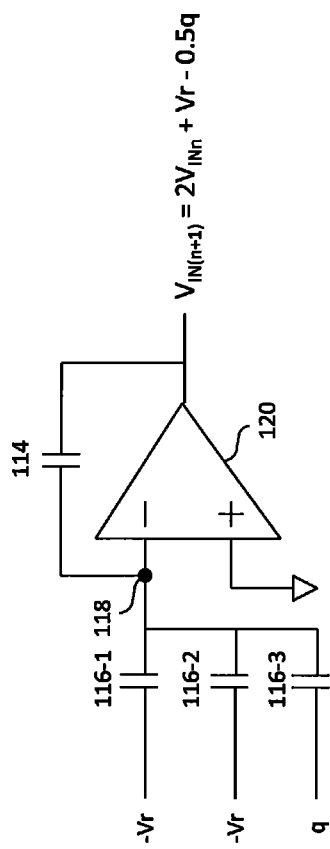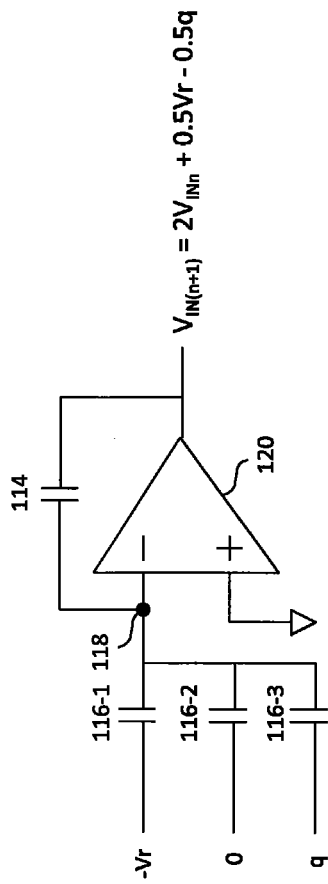
FIG. 6A
FIG. 6B

PIPELINE ANALOG-TO-DIGITAL CONVERTER

FIELD OF DISCLOSURE

The disclosed system and method relate to integrated circuits. More specifically, the disclosed system and method relate to analog-to-digital converters ("ADCs") for integrated circuits.

BACKGROUND

Pipelined analog-to-digital converters ("ADCs") are used in various integrated circuits to converter analog signals to digital signals that may be further processed by digital circuitry. For example, pipelined ADCs may be implemented in charge-coupled device ("CCD") imaging, ultrasonic medical imaging, digital receivers, base stations, digital video, cable modems and Ethernet, to name a few possible applications. Proper calibration of pipelined ADCs is important to proper functioning of the ADC and the rest of the integrated circuit that further processes the digital output of the ADC.

BRIEF DESCRIPTION OF THE DRAWINGS

FIGS. 6A-6E illustrate examples of the improved pipeline stage illustrated in FIG. 3 during calibration in accordance with FIG. 4.

DETAILED DESCRIPTION

A digital background calibration technique for a pipelined analog-to-digital converter ("ADC") that enables the entire input range of the ADC able to be calibrated. The disclosed calibration system and method advantageously relax the circuit specification while improving the resolution of the ADC.

Figure 1:
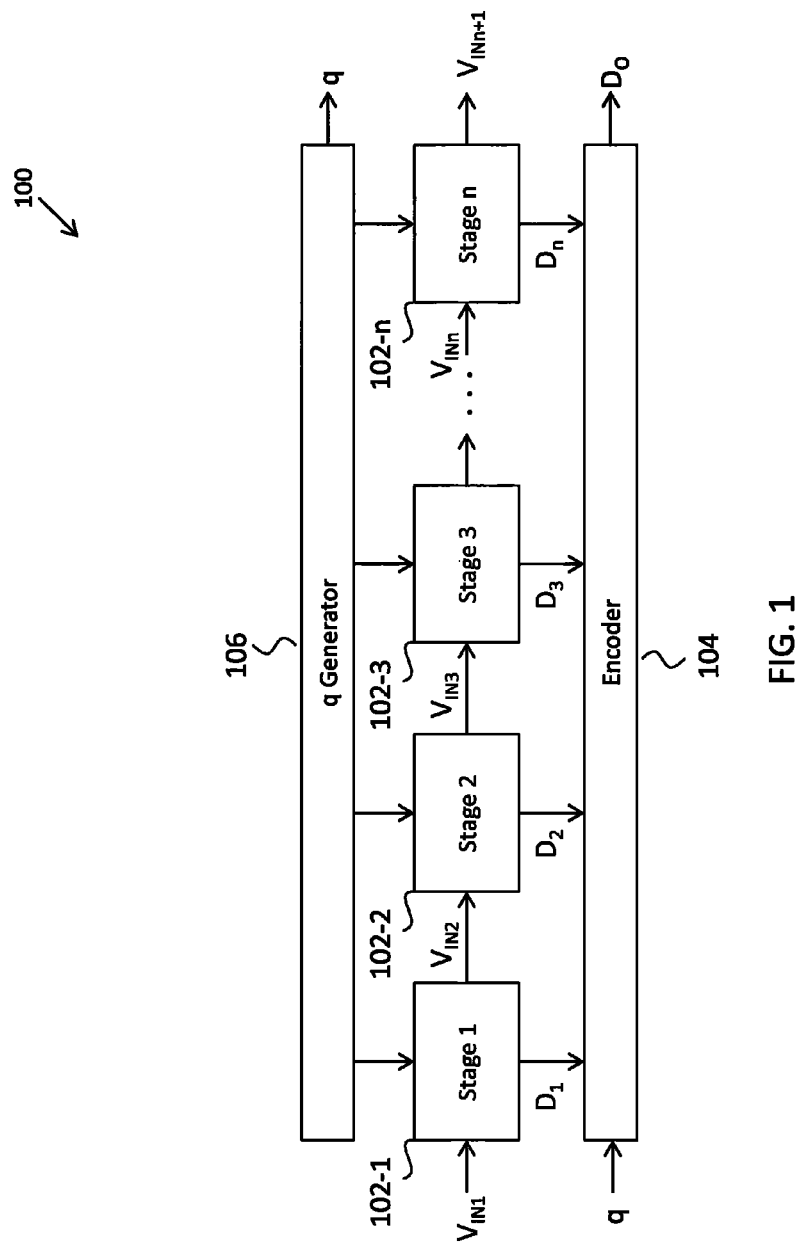
FIG. 1 illustrates one example of a pipelined analog-to-digital converter circuit.

FIG. 1 illustrates one example of a pipelined ADC 100. As is understood by one skilled in the art, pipelined ADC 100 includes a number, n, of pipelined stages 102 that are arranged in a cascade. Each stage 102 is configured to provide a respective digital output, $D_1$, $D_2$, etc., to an encoder 104 and a digital signal to q generator 106 based on an analog input signal, $V_{IN}$. Encoder 104 is configured to output a digital output signal, $D_O$, that is based on the respective digital outputs, $D_1$, $D_2$, etc., from each of the n stages 102. Q Generator 106 is configured to generate a random digital signal, q, which is used to calibrate the circuitry of the n stages 102.

Figure 2:
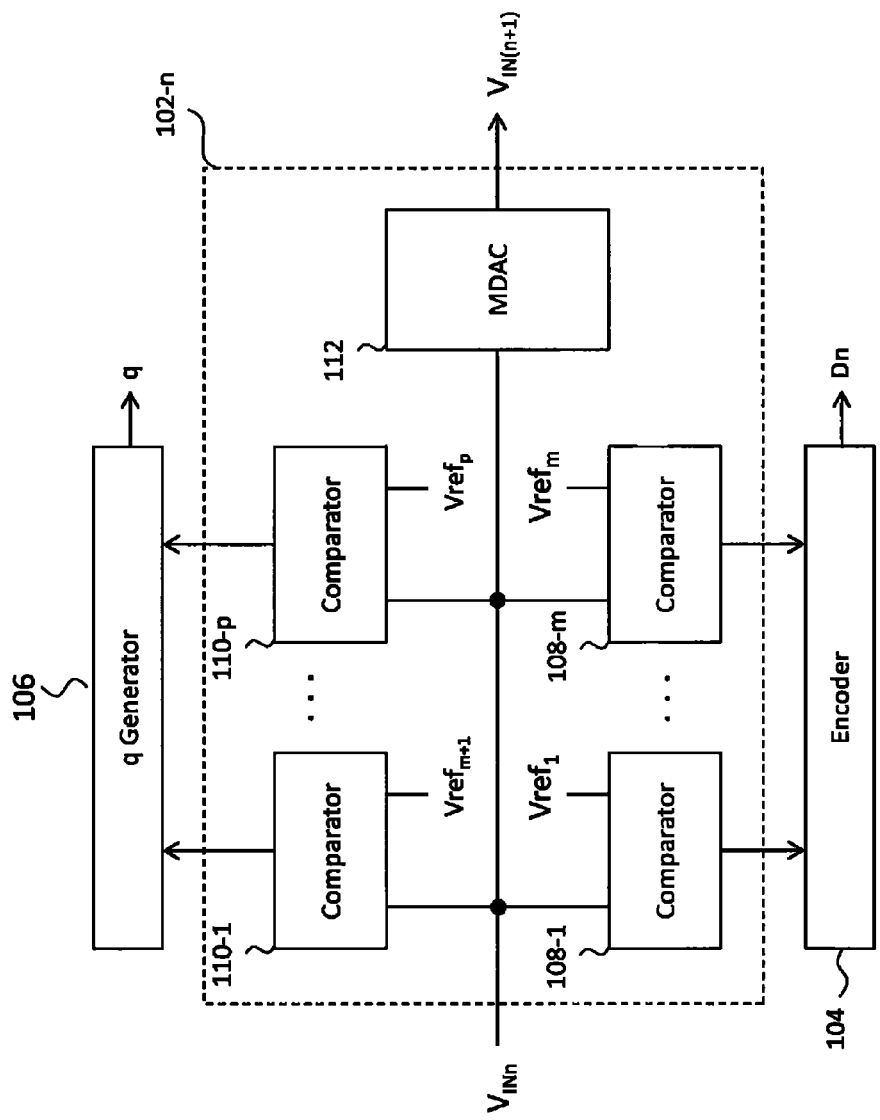
FIG. 2 is a block diagram of one example of a stage of an improved pipelined analog-to-digital converter in accordance with FIG. 1.

As best seen in FIG. 2, each stage 102 of the pipelined ADC 100 includes a number, m, of comparators 108-1, 108-$m$ (collectively referred to as "comparators 108") each configured to compare the analog input, $V_{INn}$, to a respective reference voltage, $Vref_1$, $Vref_m$ that is a portion of residual voltage, Vr. Each comparator 108 provides a respective digital bit to encoder 104. Residual voltage, Vr, may be equal to a difference between the analog input $V_{INn}$ and an analog output voltage, $V_{IN(n+1)}$, of the stage 102 multiplied by a gain factor.

Each stage 102 also includes a number, i.e., p, comparators 110-1, 110-$p$ (collectively referred to as "comparators 110") each configured to compare the analog input, $V_{INn}$, to a respective reference voltage, $Vref_{m+1}$, $Vref_p$. The numbers m and p are integers greater than or equal to one. In some embodiments, number m is greater than number p, although one skilled in the art will understand that number m may be equal to or less than number p. A switched capacitor ("SC") multiplying digital-to-analog ("MDAC") 112 is configured to receive the analog input voltage, $V_{INn}$, and in response output $V_{IN(n+1)}$, which is used as an input of a next stage 102. As will be understood by one skilled in the art, the per stage bit resolution may be increased by adding additional comparators 108, 110.

Figure 3:
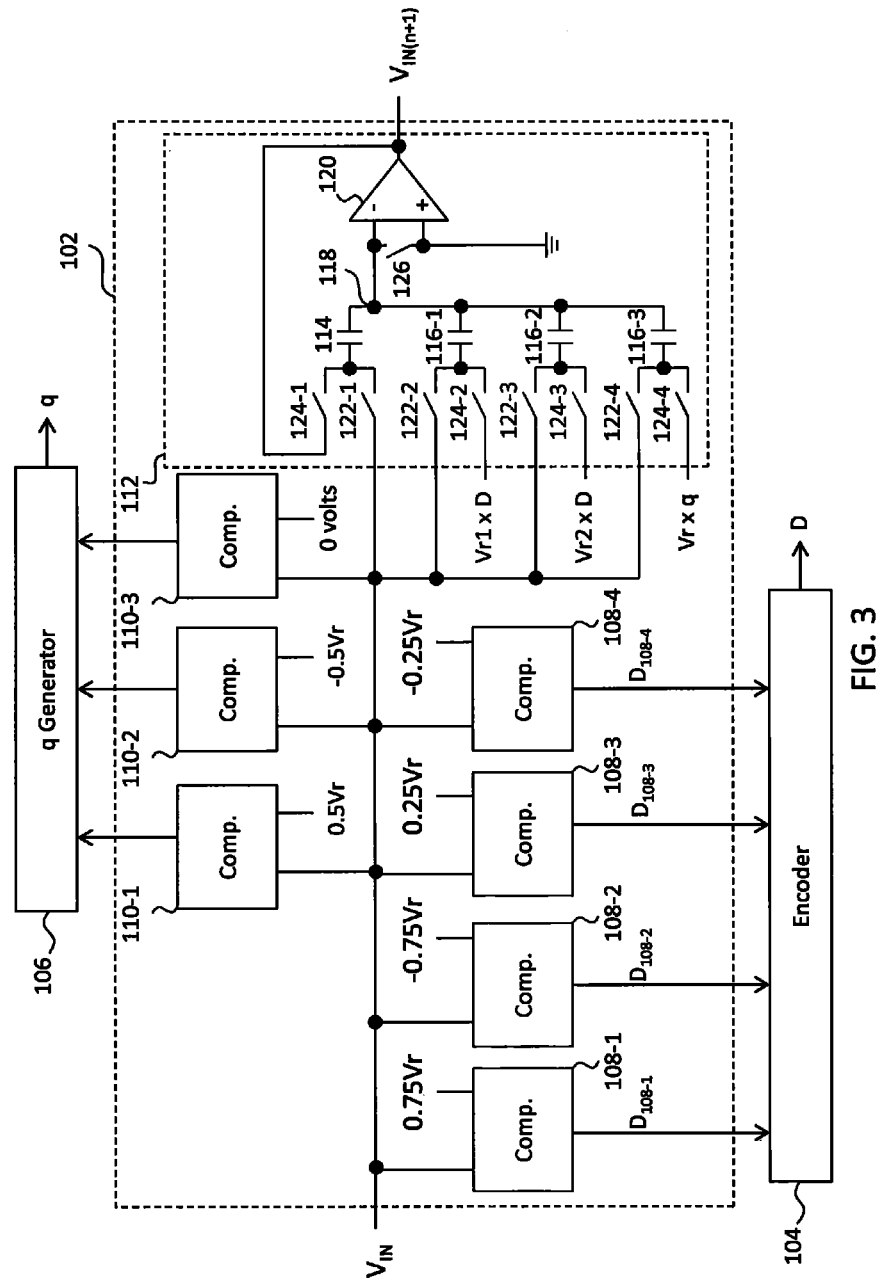
FIG. 3 is a detailed block diagram of one example of a 1.5 bit stage of an improved pipelined analog-to-digital converter in accordance with FIG. 1.

FIG. 3 is a more detailed block diagram of one example of a 1.5 bit stage 102 of a pipelined ADC 100. In the embodiment illustrated in FIG. 3, stage 102 includes four comparators 108-1, 108-2, 108-3, and 108-4 coupled to encoder 104 and to receive the analog input $V_{IN}$. Comparator 108-1 compares analog input $V_{IN}$ to a reference voltage, $Vref_1$, that is three quarters of the residual voltage, i.e., 0.75 Vr, and outputs a signal to encoder 104. Comparator 108-2 compares analog input $V_{IN}$ to reference voltage, $Vref_2$, that is equal to negative three quarters of the residual voltage, i.e., −0.75 Vr. Comparators 108-3 and 108-4 respectively compare the analog input $V_{IN}$ to plus and minus one quarter of the residual voltage, i.e., 0.25 Vr and −0.25 Vr.

Comparators 110-1 and 110-2 of stage respectively compare the analog input $V_{INn}$ to plus and minus one half of the residual voltage, i.e., 0.5 Vr and −0.5 Vr. Comparator 110-1 of stage 102 compares the analog input $V_{IN}$ to a zero or ground voltage potential. As described above, comparators 110 provide signals to q generator 106 based on the result of the comparison.

MDAC 112 includes a plurality of switch capacitors coupled in parallel with each other and to an input of operational amplifier. For example, capacitors 114 and capacitors 116-1, 116-2, and 116-3 (collectively "capacitors 116") are coupled in parallel with each and are coupled together at node 118, which is coupled to the input of operational amplifier ("op amp") 120. Capacitor 114 and each of capacitors 116 is coupled to a respective pair of switches and 122 and 124 that are configured to alternately switch in response to control signals. Switches 122 and 124 may be implemented as a PMOS or NMOS transistor as will be understood by one skilled in the art.

In particular, switches 122-1, 122-2, 122-3, and 122-4 ("switches 122") are each configured to couple the analog input $V_{IN}$ to node 118, which is coupled to the input of op amp 120, in response to a first control signal. Switches 124-1, 124-2, 124-3, and 124-4 ("switches 124") are configured to selectively couple capacitor 114 and capacitors 116-1, 116-2, and 116-3 to different voltage levels in response a second control signal. For example, switch 122-1 couples capacitor 114 to the output of op amp 118; switches 122-2 and 122-3 respectively couple capacitors 116-1 and 116-2 to the product of the residual voltage, Vr, and selective outputs, D, of encoder 104 as described below; and switch 122-4 couples capacitor 116-3 to a voltage that is a product of the output, q, of q generator 106 and residual voltage Vr.

Switches 122-1 and 124-1 are both coupled to capacitor 114 and are configured to selectively couple capacitor 114 to different voltage levels. For example, switch 122-1 is coupled to analog input $V_{IN}$ and is configured to selectively couple the analog input to capacitor 114 based on a first control signal. Switch 124-1 is coupled to the output of op amp 120 such that the voltage output by op amp 120 is selectively coupled to capacitor 114 in response to a second control signal. Switch 126 is coupled to the positive and negative terminals of op amp 120 and is configured to selectively open and close in response to the first control signal to couple the negative terminal of op amp 120 to ground.

Figure 4:
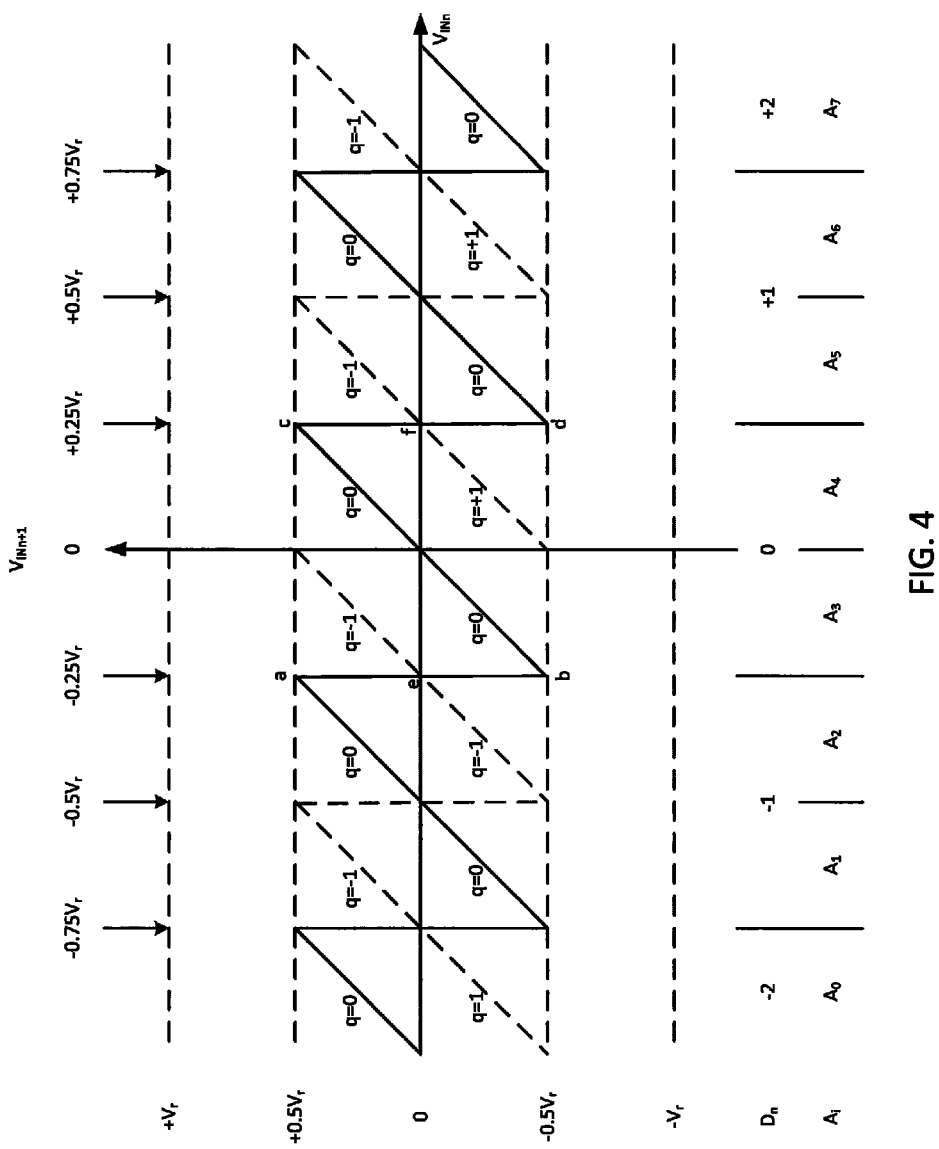
FIG. 4 illustrates one example of an improved transfer function or conversion characteristic for a pipelined analog-to-digital converter circuit in accordance with FIG. 3.

FIG. 4 illustrates one example of the output range of the pipeline stage illustrated in FIG. 3 when manipulated by an input-dependent q generation scheme such as those described in "A robust background calibration technique for switched-capacitor pipelined ADCs" by Fan et al. ("Fan et al.") and in "A 15 B-Linear, 20 MS/s, 1.5 b/stage pipelined ADC digitally calibrated with signal-dependent dithering" by Shu et al. ("Shu et al."), the entireties of which are herein incorporated by reference.

As shown in FIG. 4, the voltage input range, i.e., $V_{INn}$, of the pipeline stage 102 is divided into eight areas $A_0, A_1, \ldots,$ and $A_7$ along the x-axis with boundaries at 0 Vr, 0.5 Vr and $-0.5$ Vr along the y-axis, which is $V_{IN(n+1)}$. The leftmost area, $A_0$, corresponds to a negative two digital output, i.e., $D_n = -2$. Areas $A_1$ and $A_2$ collectively correspond to a negative one digital output, which is generated in response to the input voltage being greater than $-0.75$ Vr and less than $-0.25$ Vr. An input voltage of $-0.5$ Vr defines the separation of area $A_1$ and area $A_2$.

Area $A_3$ is defined as a voltage greater than $-0.25$ Vr and zero volts and corresponds to a digital zero output. Area $A_4$ also corresponds to a digital zero output and is defined as an input voltage that is greater than zero and less than 0.25 Vr. An input voltage between 0.25 Vr and 0.5 Vr corresponds to area $A_5$, and an input voltage between 0.5 Vr and 0.75 Vr corresponds to area $A_6$. Areas $A_5$ and $A_6$ collectively correspond to a positive digital output. Area $A_7$ corresponds to a positive two digital output and is defined as an input voltage that is greater than 0.75 Vr.

As described above, the output of the pipeline stage 102 is constrained between 0.5 Vr, and $-0.5$ Vr with a boundary at zero. The output range of a pipeline stage 102 is manipulated by the input-dependent q generation. When the input voltage, $V_{INn}$, is in the area defined as $A_0$, then the output of q-generator 106, q, may randomly oscillate between zero and one. In area $A_1$, the q generator 106 output, q, randomly oscillates between negative one and zero. Q-generator 106 oscillates between zero and negative one in areas $A_2$ and $A_3$. In areas $A_4$ and $A_6$, the q-generator 106 output oscillates between zero and one. The output of q-generator 106 oscillated between zero and negative one in areas $A_5$ and $A_7$.

Figure 5:
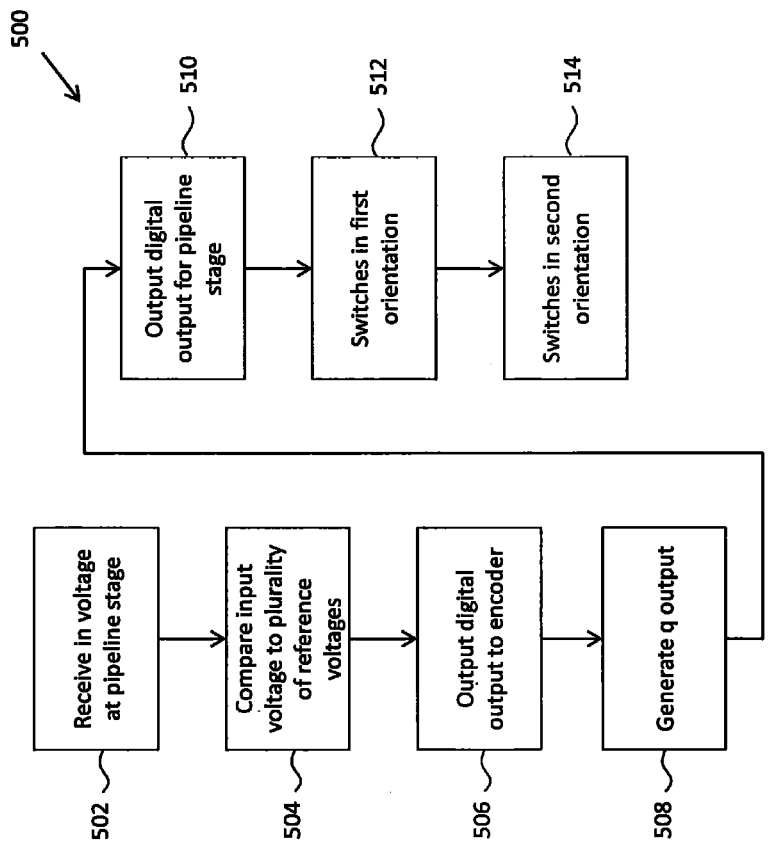
FIG. 5 is a flow diagram of one example of a method of operation of a pipeline stage in accordance with FIG. 3.

The operation of pipeline stage 102 in FIG. 3 is described with reference to FIGS. 3, 4, and 5 in which FIG. 5 is a flow diagram of one example of a method 500 of operation of a pipeline stage. At block 502, an input voltage, $V_{IN}$, is received at the input of pipeline stage 102. The input voltage $V_{IN}$ is compared to a plurality of reference voltages at block 504. For example, comparators 108-1 and 108-2 respectively compare the input voltage $V_{IN}$ to reference voltages 0.75 Vr and $-0.75$ Vr, comparators 108-3 and 108-4 respectively compare the input voltage $V_{IN}$ to reference voltages 0.25 Vr and $-0.25$ Vr, and comparators 110-1 and 110-2 respectively compare the input voltage $V_{IN}$ to reference voltages 0.5 Vr and $-0.5$ Vr. Comparator 110-3 compares the input voltage $V_{IN}$ to ground.

At block 506, comparators 108 each output their respective digital outputs, i.e., $D_{108-1}$, $D108-2$, $D_{108-3}$, and $D_{108-4}$, to encoder 104. At block 508, comparators 110-1, 110-2, and 110-3 output signals to q-generator 106 to constrain the input voltage $V_{IN}$ to $\pm 0.5$ Vr. One skilled in the art will understand the operations performed at blocks 506 and 508 may be sequentially or simultaneously performed by pipeline stage 102.

At block 510, the digital output, D, of the pipeline stage 102 is generated, and q-generator 106 outputs q at block 512. The digital output, D, produced by encoder 104 and the generation of q by q-generator 106 may be generated as described in Fan et al. and Shu et al. The digital output, D, and output of q-generator 106, q, are used MDAC 112 to provide a voltage output as described below.

At block 514, switches 122 of MDAC 112 are in a closed orientation, switches 124 of MDAC 112 are in an open orientation, and switch 126 is in a closed orientation. With switches 122 and 126 closed and switches 124 open, capacitor 114 and capacitors 116 are all connected to input voltage $V_{IN}$ and to ground at node 118. The positive and negative terminals of op amp 120 are also both coupled to ground.

At block 516, the switches 122, 124, and 126 change their orientation such that switches 122 and 126 are in an open orientation and switches 124 are in a closed orientation such that each of capacitor 114 and capacitors 116 are disconnected from the input voltage $V_{IN}$. Instead of being connected to the input voltage $V_{IN}$, capacitor 114 is coupled to the output of op amp 120, capacitor 116-1 is coupled to a voltage equal to Vr1×D, capacitor 116-2 is coupled to a voltage equal to Vr2×D, and capacitor 116-3 is coupled to a voltage equal to Vr×q. In some embodiments, Vr1×D is equal to $-$Vr when $D=-2$, Vr1×D is equal to Vr when D is equal to 1 or 2, and Vr1×D is equal to zero for all other values of D. In some embodiments, Vr2×D is equal to $-$Vr when $D=-1$ or $-2$, Vr2×D is equal to Vr when D is equal to 2, and Vr2×D is equal to zero for all other values of D.

The positive terminal of op amp 120 is coupled to ground, and the positive terminal of op amp 120 is coupled to node 118. The output voltage of op amp 120, $V_{IN(n+1)}$, which is the input voltage of the next pipeline stage, varies based on the values of D and q.

For example, FIGS. 6A-6E illustrate equivalent circuits of MDAC 112 based on the D and q values in accordance with the calibration scheme illustrated in FIG. 4. Capacitor 114 has a capacitance, $C_{114}$, that is different from the capacitance of each of capacitors 116 ($C_{116-1}$, $C_{116-2}$, and $C_{116-3}$). In some embodiments, capacitor 114 has a capacitance equal to twice the capacitance of each of capacitors 116 (i.e., $C_{114} = 2 * C_{116-1} = 2 * C_{116-2} = 2 * C_{116-3}$). The output of q generator, q, has a voltage equal to $\pm$Vr.

FIG. 6A illustrates MDAC 112 in area $A_o$ of FIG. 4, i.e., Dn=$-2$ and q is either 0 or Vr. As shown in FIG. 6A, capacitors 116-1 and 116-2 are coupled to voltages equal to $-$Vr, and capacitor 116-3 is coupled to receive the output of q generator 106, q, which oscillates between zero and Vr. The output of op amp 120 (MDAC 112 and the pipeline stage 102) is equal to $2V_{INn}+Vr-0.5q$.

FIG. 6B illustrates MDAC 112 in the areas $A_1$ and $A_2$, i.e., Dn=$-1$ and q is either $-$Vr or 0. In areas $A_1$ and $A_2$, capacitor 116-1 is coupled to receive a voltage equal to $-$Vr, capacitor 116-2 is coupled to receive a zero voltage (since encoder outputs a $-1$, i.e., Dn=$-1$), and capacitor 116-3 is coupled to receive the output of q generator 106, q, which oscillates between 0 and −Vr. The output of op amp 120 (MDAC 112 and the pipeline stage 102) is equal to $2V_{INn}+0.5Vr-0.5q$.

Figure 6C:
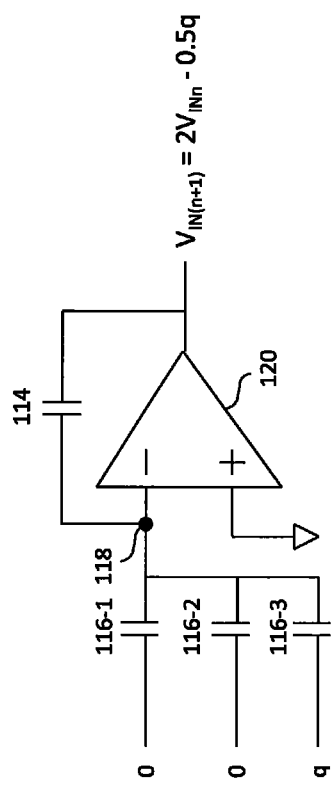

The inputs and outputs of MDAC 112 in areas $A_3$ and $A_4$ are illustrated in FIG. 6C. As shown in FIG. 6C, capacitors 116-1 and 116-2 are both coupled to receive a zero voltage since encoder outputs a zero, i.e., Dn=0, in accordance with FIG. 4. Capacitor 116-3 is coupled to receive the output of q generator 106, q, which oscillates between Vr, 0, and −Vr. The output of op amp 120 (MDAC 112 and the pipeline stage 102) is equal to $2V_{INn}-0.5q$.

Figure 6D:
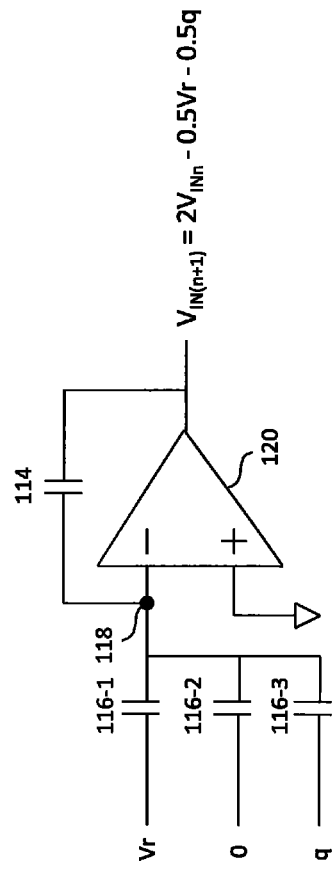

FIG. 6D illustrates the inputs and outputs of MDAC 112 in areas of $A_5$ and $A_6$. In these areas, capacitor 116-1 is coupled to receive the voltage of Vr, capacitor 116-2 is coupled to receive zero, and the output of q generator 106, which oscillates between Vr, 0, and −Vr, is coupled to capacitor 116-3. The output of op amp 120 (MDAC 112 and the pipeline stage 102) in regions $A_5$ and $A_6$ is equal to $2V_{INn}-0.5Vr-0.5q$.

Figure 6E:
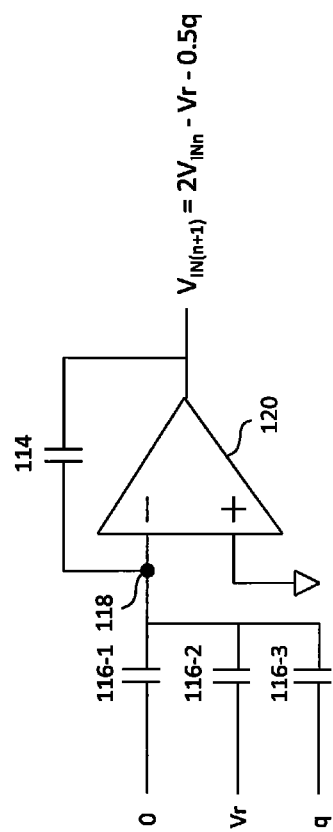

The inputs and outputs of MDAC 112 in area $A_7$ are shown in FIG. 6E. As shown in FIG. 6E, capacitor 116-1 is coupled to receive a voltage of zero, capacitor 116-2 is coupled to receive the voltage of Vr, and capacitor 116-3 receives a voltage of zero or −Vr, which is the output of q generator 106. The output of op amp 120 (MDAC 112 and the pipeline stage 102) in regions $A_5$ and $A_6$ is equal to $2V_{INn}-Vr-0.5q$.

Figure 7:
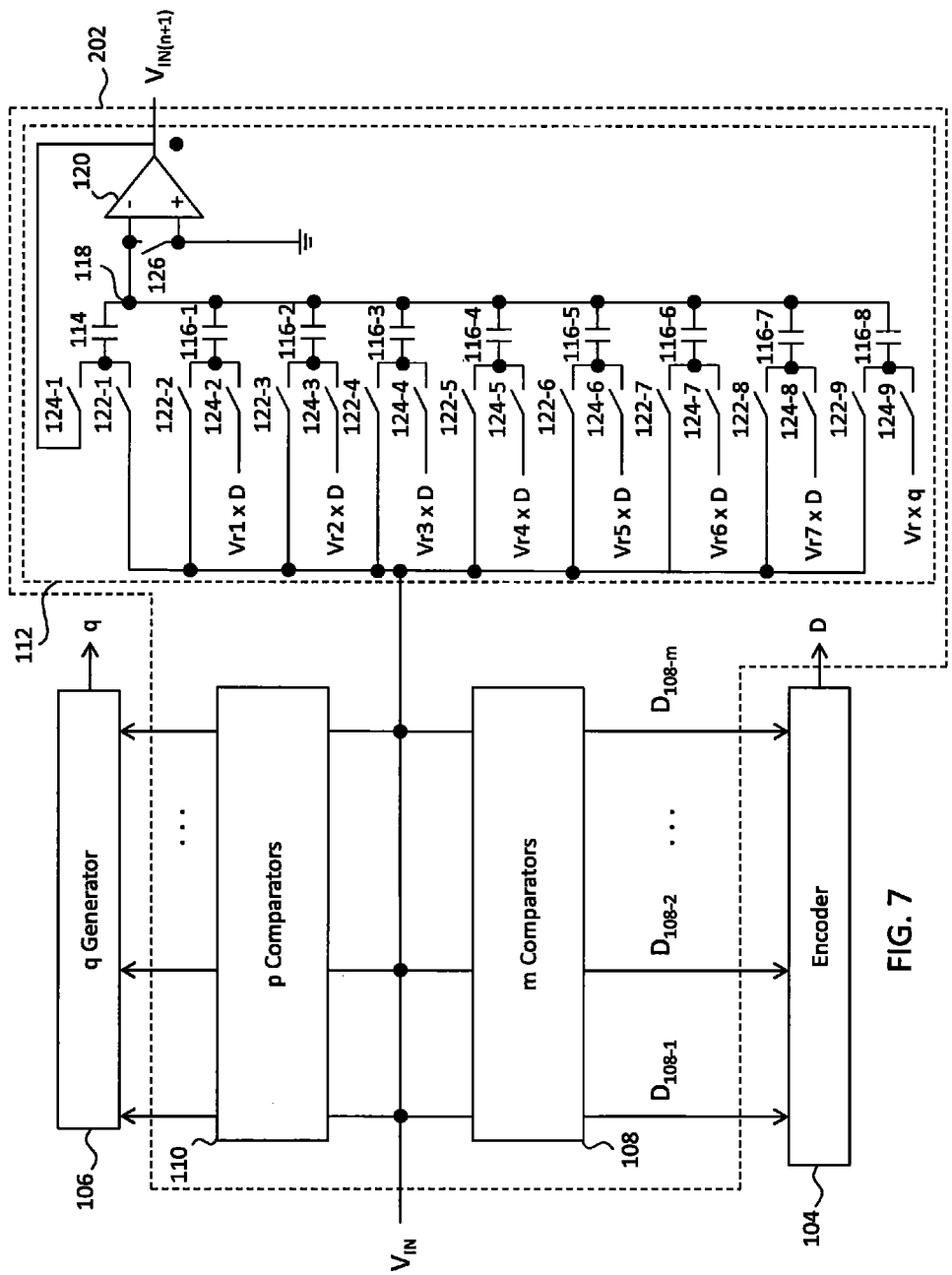
FIG. 7 is a detailed block diagram of one example of a 2.5 bit stage of an improved pipelined analog-to-digital converter in accordance with FIG. 1.

The number of bits per stage may be increased beyond 1.5 bits per stage. For example, FIG. 7 illustrates one example of a 2.5 bit stage 202 of a pipelined analog-to-digital converter. As shown in FIG. 7, stage 202 includes a number, m, of comparators 108 and a number, p, comparators 110. In this example, the sum of m and p is equal to 15, i.e., seven pairs of comparators and one single comparator. The single comparator is configured to compare input voltage, $V_{IN}$, to a ground potential and each of the seven pairs of transistors are configured to compare the input voltage, $V_{IN}$, to a respective positive and negative reference voltage pair, e.g., $\pm\frac{1}{8}Vr$, $\pm\frac{1}{4}Vr$, $\pm\frac{3}{8}Vr$, $\pm\frac{1}{2}Vr$, $\pm\frac{5}{8}Vr$, $\pm\frac{3}{4}Vr$, and $\pm\frac{7}{8}Vr$.

Figure 8:
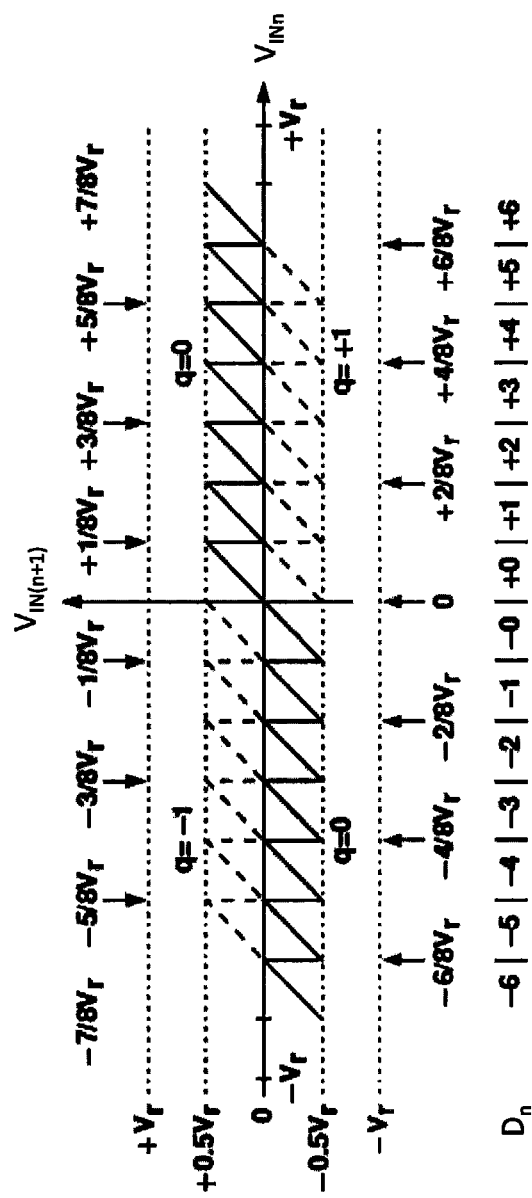
FIG. 8 illustrates one example of a transfer function or conversion characteristic for a pipelined analog- to-digital converter circuit in accordance with FIG. 7.

As shown in FIG. 8, the voltage input range of pipeline stage 202 is divided into fourteen areas along the x-axis with boundaries at 0, $\pm\frac{1}{8}Vr$, $\pm\frac{1}{4}Vr$, $\pm\frac{3}{8}Vr$, $\pm\frac{1}{2}Vr$, $\pm\frac{5}{8}Vr$, $\pm\frac{3}{4}Vr$, and $\pm\frac{7}{8}Vr$. The leftmost area corresponds to a negative six digital output, i.e., $D_n=-6$, and the areas increase by one moving left to right along the x-axis with the right-most area corresponding to a positive 6, i.e., $D_n-6$.

The output range of a pipeline stage 202 is manipulated by the input-dependent q generation. When the input voltage, $V_{INn}$, is to the left of the y-axis, then the output of q-generator 106, q, may randomly oscillate between zero and negative one. In area to the left of the y-axis, the q generator 106 output, q, randomly oscillates between zero and one.

Referring again to FIG. 7, the input node that receives $V_{IN}$ is coupled to a plurality of switches 122. Switch 122-1 is coupled to capacitor 114, which is also coupled to the output of op amp 120 through switch 124-1. Each of the other switches 122-2:122-9 is coupled to a respective capacitor 116-1 through 116-8. Capacitors 116 are each respectively coupled to a switch 124-2:124-9 for coupling the capacitor 116 to a voltage based on residual voltage, Vr, multiplied by a digital output of encoder 104, Dn, in a similar manner as described above with reference to FIGS. 3-6E. One skilled in the art will understand that the bits per stage may be increased. The digital background calibration techniques for a pipelined ADC described herein advantageously relax the circuit specification while improving the resolution of the ADC.

In some embodiments, a pipelined ADC includes a first, second, and third pairs of comparators. The first pair of comparators compare an input voltage to a first positive reference voltage and to a first negative reference voltage. The second pair of comparators compare the input voltage to a second positive reference voltage and to a second negative reference voltage. Each comparator of the first and second pairs of comparators outputs a digital signal to an encoder. A third pair of comparators compares the input voltage to a third positive reference voltage and to a third negative reference voltage, and a comparator compares the input voltage to ground. The comparator and each comparator of the third pair of comparators is configured to output respective digital signals to an encoder. A multiplying digital-to-analog converter outputs a voltage based on the input voltage, an output from the encoder, and an output of the random number generator.

In some embodiments, a calibration method includes receiving an input voltage at an input node, comparing the input voltage to a first positive reference voltage and to a first negative reference voltage at a first pair of comparators to generate first digital output signal pair, and comparing the input voltage to a second positive reference voltage and to a second negative reference voltage at a second pair of comparators to generate second digital output signal pair. The input voltage is compared to a third positive reference voltage and to a third negative reference voltage at a third pair of comparators to generate third digital output signal pair. The input voltage is compared to ground to generate a digital output signal. A random number is generated based on the digital output signal and third digital output signal pair. An encoded digital signal based on the first and second digital output signal pairs is generated, and an output voltage based on the input voltage, an output from the encoder, and an output of the random number generator is output.

In some embodiments, a pipelined analog to digital converter includes a plurality of stages each coupled to a random number generator and to an encoder. Each of the plurality of stages includes a comparator and first, second, and third pairs of comparators. The first pair of comparators is configured to compare an input voltage received at an input node of the stage to a first positive reference voltage and a first negative reference voltage, respectively. Each of the first pair of comparators is configured to output respective digital signals to the encoder. The second pair of comparators is configured to compare the input voltage received at the input node of the stage to a second positive reference voltage and a second negative reference voltage, respectively. Each of the second pair of comparators is configured to output respective digital signal to the encoder. The third pair of comparators is configured to compare the input voltage received at the input node of the stage to a third positive reference voltage and a third negative reference voltage, respectively. Each of the third pair of comparators is configured to output respective signals to the random number generator. The comparator is configured to compare the input voltage received at the input node to ground voltage potential and output a signal to the random generator. A multiplying digital-to-analog converter is configured to output a voltage based on the input voltage, an output from the encoder, and an output of the random number generator.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A stage of a pipelined analog-to-digital converter, comprising:
a first pair of comparators configured to compare an input voltage received at an input node to a first positive reference voltage and to a first negative reference voltage, respectively, each of the first pair of comparators configured to output respective digital signals to an encoder;
a second pair of comparators configured to compare the input voltage received at the input node to a second positive reference voltage and to a second negative reference voltage, respectively, each of the second pair of comparators configured to output respective digital signals to the encoder;
a third pair of comparators configured to compare the input voltage received at the input node to a third positive reference voltage and to a third negative reference voltage, respectively, each of the third pair of comparators configured to output respective signals to a random number generator;
a comparator configured to compare the input voltage received at the input node to ground voltage potential and output a signal to the random generator; and
a multiplying digital-to-analog converter configured to output a voltage based on the input voltage, an output from the encoder, and an output of the random number generator.

2. The stage of the pipelined analog-to-digital converter of claim 1, wherein the first positive reference voltage is three quarters of a residual voltage of the stage of the pipelined analog-to-digital converter, and the first negative reference voltage is three quarters of the residual voltage of the stage of the pipelined analog-to-digital converter that negative with respect to ground.

3. The stage of the pipelined analog-to-digital converter of claim 2, wherein the second positive reference voltage is one quarter of the residual voltage of the stage of the pipelined analog-to-digital converter, and the second negative reference voltage is one quarter of the residual voltage of the stage of the pipelined analog-to-digital converter that negative with respect to ground.

4. The stage of the pipelined analog-to-digital converter of claim 3, wherein the third positive reference voltage is one half of the residual voltage of the stage of the pipelined analog-to-digital converter, and the third negative reference voltage is one half of the residual voltage of the stage of the pipelined analog-to-digital converter that negative with respect to ground.

5. The stage of the pipelined analog-to-digital converter of claim 1, wherein the multiplying digital-to-analog converter is a switched capacitor multiplying digital-to-analog converter including a plurality of switches and a plurality of capacitors.

6. The stage of the pipelined analog-to-digital converter of claim 5, wherein each of the plurality of capacitors is coupled to a respect pair of switches that are alternatively opened and closed to coupled and decouple the capacitors to the input voltage.

7. The stage of the pipelined analog-to-digital converter of claim 5, wherein a first one of the plurality of capacitors is coupled to an input of an operational amplifier and to first and second switches, the first switch configured to selectively couple the first capacitor to the input node, and the second switch configured to selectively couple the first capacitor to a voltage equal to a product of the residual voltage and the output of the encoder.

8. The stage of the pipelined analog-to-digital converter of claim 6, wherein a second one of the plurality of capacitors is coupled to the input of the operational amplifier and to third and fourth switches, the third switch configured to selectively couple the second capacitor to the input node, and the fourth switch configured to selectively couple the second capacitor to a voltage equal to a product of the residual voltage and the output of the random number generator.

9. The stage of the pipelined analog-to-digital converter of claim 7, wherein a third one of the plurality of capacitors is coupled to the input of the operational amplifier and to fifth and sixth switches, the fifth switch configured to selectively couple the third capacitor to the input node, and the sixth switch configured to selectively couple the third capacitor to an output of the operational amplifier.

10. A calibration method, comprising:
receiving an input voltage at an input node;
comparing the input voltage to a first positive reference voltage and to a first negative reference voltage at a first pair of comparators to generate first digital output signal pair;
comparing the input voltage to a second positive reference voltage and to a second negative reference voltage at a second pair of comparators to generate second digital output signal pair;
comparing the input voltage to a third positive reference voltage and to a third negative reference voltage at a third pair of comparators to generate third digital output signal pair;
comparing the input voltage to ground to generate a digital output signal;
generating a random number based on the digital output signal and third digital output signal pair;
generating an encoded digital signal based on the first and second digital output signal pairs; and
outputting an output voltage based on the input voltage, an output from the encoder, and an output of the random number generator.

11. The calibration method of claim 10, wherein outputting the output voltage includes
selectively switching a first plurality of switches coupled to a respective number of capacitors, and
selectively switching a second plurality of switches coupled to the respective number of capacitors.

12. The calibration method of claim 10, wherein
the first positive reference voltage is three quarters of a residual voltage, and the first negative reference voltage is three quarters of the residual voltage of the stage of the pipelined analog-to-digital converter that negative with respect to ground;
the second positive reference voltage is one quarter of the residual voltage, and the second negative reference voltage is one quarter of the residual voltage of the stage of the pipelined analog-to-digital converter that negative with respect to ground; and
the third positive reference voltage is one half of the residual voltage, and the third negative reference voltage is one half of the residual voltage of the stage of the pipelined analog-to-digital converter that negative with respect to ground.

13. A pipelined analog to digital converter, comprising:
a plurality of stages each coupled to a random number generator and to an encoder, each of the plurality of stages including:
a first pair of comparators configured to compare an input voltage received at an input node of the stage to a first positive reference voltage and a first negative reference voltage, respectively, each of the first pair of comparators configured to output respective digital signals to the encoder;

a second pair of comparators configured to compare the input voltage received at the input node of the stage to a second positive reference voltage and a second negative reference voltage, respectively, each of the second pair of comparators configured to output respective digital signal to the encoder;

a third pair of comparators configured to compare the input voltage received at the input node of the stage to a third positive reference voltage and a third negative reference voltage, respectively, each of the third pair of comparators configured to output respective signals to the random number generator;

a comparator configured to compare the input voltage received at the input node to ground voltage potential and output a signal to the random generator; and a multiplying digital-to-analog converter configured to output a voltage based on the input voltage, an output from the encoder, and an output of the random number generator.

14. The pipelined analog-to-digital converter of claim 13, wherein the first positive reference voltage is three quarters of a residual voltage of the stage of the pipelined analog-to-digital converter, and the first negative reference voltage is three quarters of the residual voltage of the stage of the pipelined analog-to-digital converter that negative with respect to ground.

15. The pipelined analog-to-digital converter of claim 14, wherein the second positive reference voltage is one quarter of the residual voltage of the stage of the pipelined analog-to-digital converter, and the second negative reference voltage is one quarter of the residual voltage of the stage of the pipelined analog-to-digital converter that negative with respect to ground.

16. The pipelined analog-to-digital converter of claim 15, wherein the third positive reference voltage is one half of the residual voltage of the stage of the pipelined analog-to-digital converter, and the third negative reference voltage is one half of the residual voltage of the stage of the pipelined analog-to-digital converter that negative with respect to ground.

17. The pipelined analog-to-digital converter of claim 13, wherein the multiplying digital-to-analog converter is a switched capacitor multiplying digital-to-analog converter including a plurality of switches and a plurality of capacitors.

18. The pipelined analog-to-digital converter of claim 14, wherein a first one of the plurality of capacitors is coupled to an input of an operational amplifier and to first and second switches, the first switch configured to selectively couple the first capacitor to the input node, and the second switch configured to selectively couple the first capacitor to a voltage equal to a product of the residual voltage and the output of the encoder.

19. The pipelined analog-to-digital converter of claim 18, wherein a second one of the plurality of capacitors is coupled to the input of the operational amplifier and to third and fourth switches, the third switch configured to selectively couple the second capacitor to the input node, and the fourth switch configured to selectively couple the second capacitor to a voltage equal to a product of the residual voltage and the output of the random number generator.

20. The pipelined analog-to-digital converter of claim 19, wherein a third one of the plurality of capacitors is coupled to the input of the operational amplifier and to fifth and sixth switches, the fifth switch configured to selectively couple the third capacitor to the input node, and the sixth switch configured to selectively couple the third capacitor to an output of the operational amplifier.

* * * * *